(12) United States Patent
Durkee

(10) Patent No.: US 11,977,102 B2
(45) Date of Patent: May 7, 2024

(54) DIODE VOLTAGE MEASUREMENT SYSTEMS

(71) Applicant: Simmonds Precision Products, Inc., Vergennes, VT (US)

(72) Inventor: Scott R. Durkee, New Haven, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 209 days.

(21) Appl. No.: 17/555,199

(22) Filed: Dec. 17, 2021

(65) Prior Publication Data

US 2023/0194575 A1  Jun. 22, 2023

(51) Int. Cl.
*G01R 19/00* (2006.01)
*G01R 27/26* (2006.01)

(52) U.S. Cl.
CPC ..... *G01R 19/0084* (2013.01); *G01R 27/2605* (2013.01)

(58) Field of Classification Search
CPC ............... G01R 19/00; G01R 19/0084; G01R 19/0092; G01R 27/00; G01R 27/02; G01R 27/26; G01R 27/2605; G01R 31/00; G01R 31/26; G01R 31/2607; G01R 31/2632; G01R 31/2633; G01F 23/00; G01F 23/22
USPC ................................................ 324/76.11, 143
See application file for complete search history.

(56) References Cited

U.S. PATENT DOCUMENTS

| | | | |
|---|---|---|---|
| 3,465,587 A | 9/1969 | Pierce | |
| 4,630,218 A * | 12/1986 | Hurley | G01R 15/22 702/64 |
| 6,748,803 B1 | 6/2004 | Durkee et al. | |
| 8,922,216 B2 * | 12/2014 | Dauchy | G01R 31/396 324/426 |
| 9,074,921 B1 | 7/2015 | Parker, Jr. et al. | |
| 9,977,455 B2 * | 5/2018 | Dai | G05F 5/00 |
| 2021/0252871 A1 | 8/2021 | Studer et al. | |

FOREIGN PATENT DOCUMENTS

JP           65036568 A        4/1975

OTHER PUBLICATIONS

Extended European Search Report, of the European Patent Office, dated May 5, 2023, in corresponding European Patent Application No. 22208891.6.

(Continued)

*Primary Examiner* — Hoai-An D. Nguyen
(74) *Attorney, Agent, or Firm* — Locke Lord LLP; Gabrielle L. Gelozin; Daniel J. Fiorello

(57) ABSTRACT

A diode voltage measurement system includes a plurality of diodes connected in series along a single line. The plurality of diodes include N diodes. The system includes a plurality of capacitors for at least N−1 of the diodes. Each capacitor is connected in parallel to the single line with a respective diode to form a respective diode-capacitor (DC) pair. Each DC pair is configured such that each DC pair reaches a steady state voltage at a different time. The system includes a current supply connected to the single line to supply a current to the line. The system includes a control module configured to sense a total voltage across the single line and to successively determine voltage of each diode from the total voltage based on the current, a known total steady state voltage, and known time-to-steady-state-voltages of each DC pair and/or diode.

14 Claims, 3 Drawing Sheets

(56) References Cited

OTHER PUBLICATIONS

Akber Kashif et al: "Development of a complete cold electronic based discrete level sensor", Indian Journal of Cryogenics., vol. 44, No. 1, Jan. 1, 2019, p. 166; XP093038665, in ISSN: 0379-0479, DOI: 10.5958/2349-2120.2019.00029.3 * abstract, figure 1, 4-6 * paragraph [Introduction]—paragraph [Methodology] *.

* cited by examiner

DIODE VOLTAGE MEASUREMENT SYSTEMS

FIELD

This disclosure relates to diode voltage measurement systems, e.g., for $H_2$ fuel sensors.

BACKGROUND

Si based diodes have been shown to be effective as point level measurement elements for measuring the gas/liquid level interface in extreme cryogenic environments such as liquid $H_2$. A step change in the forward voltage is observed in the diode as it becomes submerged in the liquid $H_2$ provided enough self-heating is applied to the diode whereby the additional thermal capacity of the liquid $H_2$ creates a net downward change in the junction temperature. This then manifests as a positive change in voltage forward in the immersed diode indicating that the diode has transitioned from the gaseous to the liquid environment. However, for N diodes in series, N+1 wires is traditionally needed to sense voltage across each diode individual.

Such conventional methods and systems have generally been considered satisfactory for their intended purpose. However, there is still a need in the art for improved diode measurement systems. The present disclosure provides a solution for this need.

SUMMARY

In accordance with at least one aspect of this disclosure, a diode voltage measurement system can include a plurality of diodes connected in series along a single line. The plurality of diodes can include N diodes. The system can include a plurality of capacitors for at least N−1 of the diodes. Each capacitor can be connected in parallel to the single line with a respective diode to form a respective diode-capacitor (DC) pair. Each DC pair can be configured such that each DC pair reaches a steady state voltage at a different time. The system can include a current supply connected to the single line to supply a current to the line. The system can include a control module configured to sense a total voltage across the single line and to successively determine voltage of each diode from the total voltage based on the current, a known total steady state voltage, and known time-to-steady-state-voltages of each DC pair and/or diode.

The control module can be configured to determine a liquid contact state of each diode based on the voltage of each diode (e.g., as a fuel quantity sensor for $H_2$). Any other suitable logic and/or use for the diodes is contemplated herein.

The control module can be configured to determine the voltage of a respective diode of a last-to-steady-state-voltage DC pair first, and to successively determine each voltage of each successive diode in order of decreasing time-to-steady-state-voltage until all voltages of all diodes have been determined. The control module can be configured to determine a capacitance of the last-to-steady-state-voltage capacitor by sampling total voltage at two times, both of the two times being after all other faster-to-steady-state DC pairs and/or diodes have reached steady state voltage, wherein capacitance is a function of the current and the total voltages at the two times.

The control module can be configured to determine the next capacitance of the next slowest DC pair and/or diode using the determined capacitance of the last-to-steady-state-voltage capacitor and by sampling total voltage at a different two times, both of the different two times being after all other faster DC pairs and/or diodes have reached steady state voltage, but before the next slowest DC pair and/or diode reaches steady state voltage. The control module can be configured to determine a voltage of a respective diode based on a determined capacitance of a respective capacitor.

In certain embodiments, a first-to-steady-state-voltage diode does not have an associated capacitor such that there are N−1 capacitors for N diodes, and thus the first to steady-state-voltage diode has no delay to steady state voltage. The control module can be configured to determine the voltage of the first-to-steady-state-voltage diode last by subtracting all other determined voltages from the total steady state voltage.

The time-to-steady-state of each DC pair and/or diode can be separated by a multiple of at least 5. In certain embodiments, each capacitor can include the same dielectric material, and a nominal capacitance of each capacitor can be selected to provide a time-to-steady-state that is separated by a multiple of at least 5.

In certain embodiments, the current can be a step current. Any suitable current supply is contemplated herein.

In accordance with at least one aspect of this disclosure, a control module can be configured to sense a total voltage across a single line and to successively determine a voltage across each of a plurality of diodes on the single line from the total voltage based on a current and a known time-to-steady-state-voltage of at least one diode-capacitor (DC) pair having at least one diode of the plurality of diodes. The control module can be or include any suitable embodiment of a control module disclosed herein, e.g., described above.

In accordance with at least one aspect of this disclosure, a non-transitory computer readable medium can include computer executable instructions configured to cause a computer to perform a method. The method can include sensing a total voltage across a single line, and successively determining voltage across each of a plurality of diodes on the single line from the total voltage based on a current and a known time-to-steady-state-voltages of at least one diode-capacitor (DC) pair having at least one diode of the plurality of diode. The method can include determining a liquid contact state of each diode based on the voltage of each diode.

The method can include determining the voltage of a respective diode of a last-to-steady-state-voltage DC pair first, and successively determining each voltage of each successive diode in order of decreasing time-to-steady-state-voltage until all voltages of all diodes have been determined. The method can include determining a capacitance of the last-to-steady-state-voltage capacitor by sampling total voltage at two times, both of the two times being after all other faster-to-steady-state DC pairs and/or diodes have reached steady state voltage. The capacitance can be a function of the current and the total voltages at the two times.

The method can include any other suitable function of any suitable embodiment of a control module disclosed herein, e.g., described above. The method can include any other suitable method(s) and/or portion(s) thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
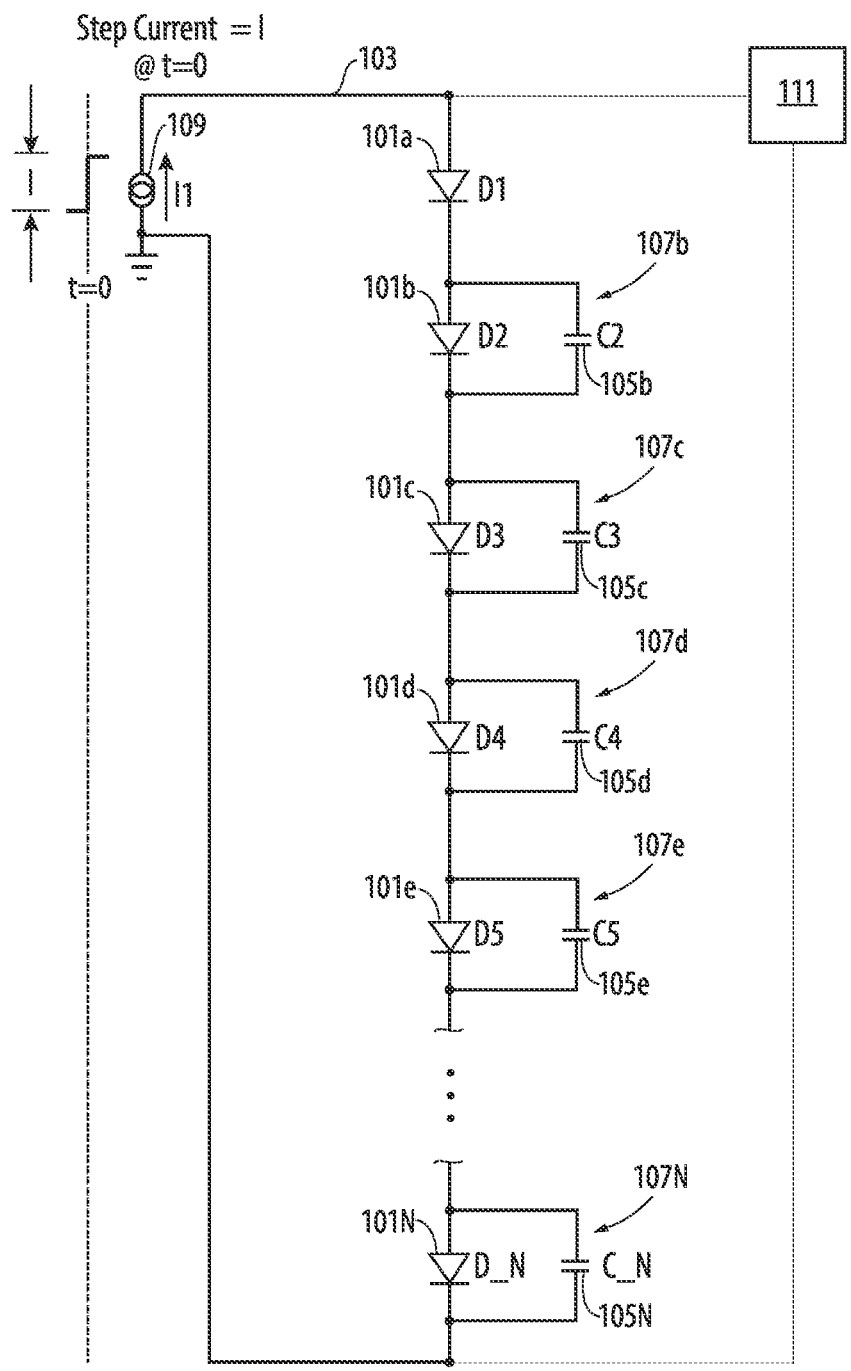
FIG. 1 is a schematic diagram of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100.

Figure 2A:
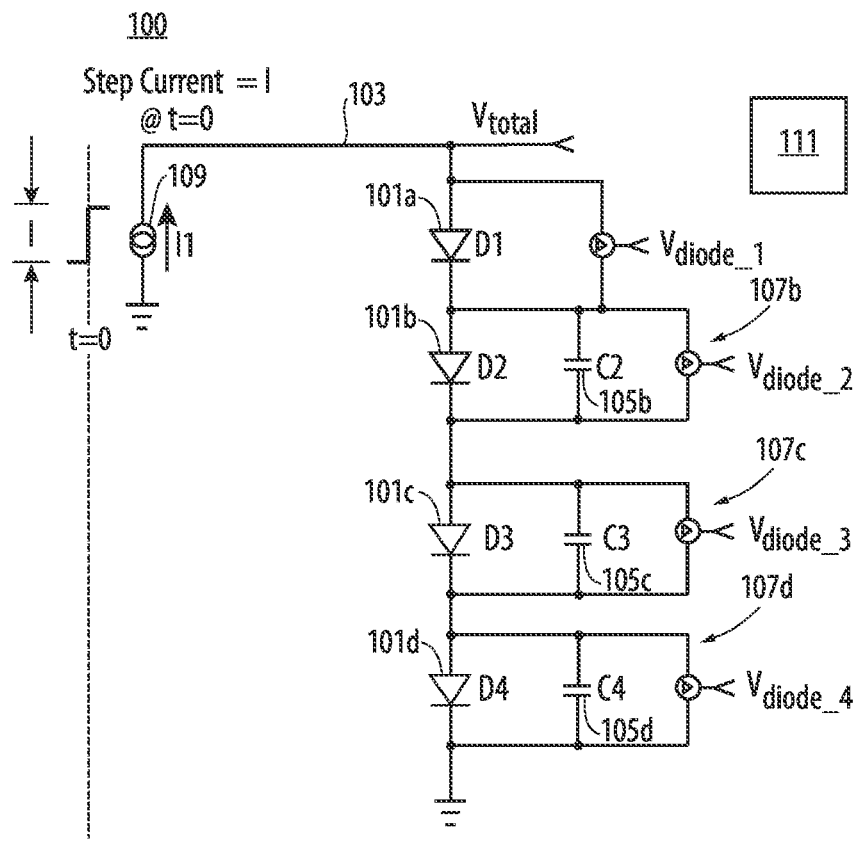
FIG. 2A is a schematic diagram of an embodiment of a system in accordance with this disclosure, shown having four diodes.
Figure 2B:
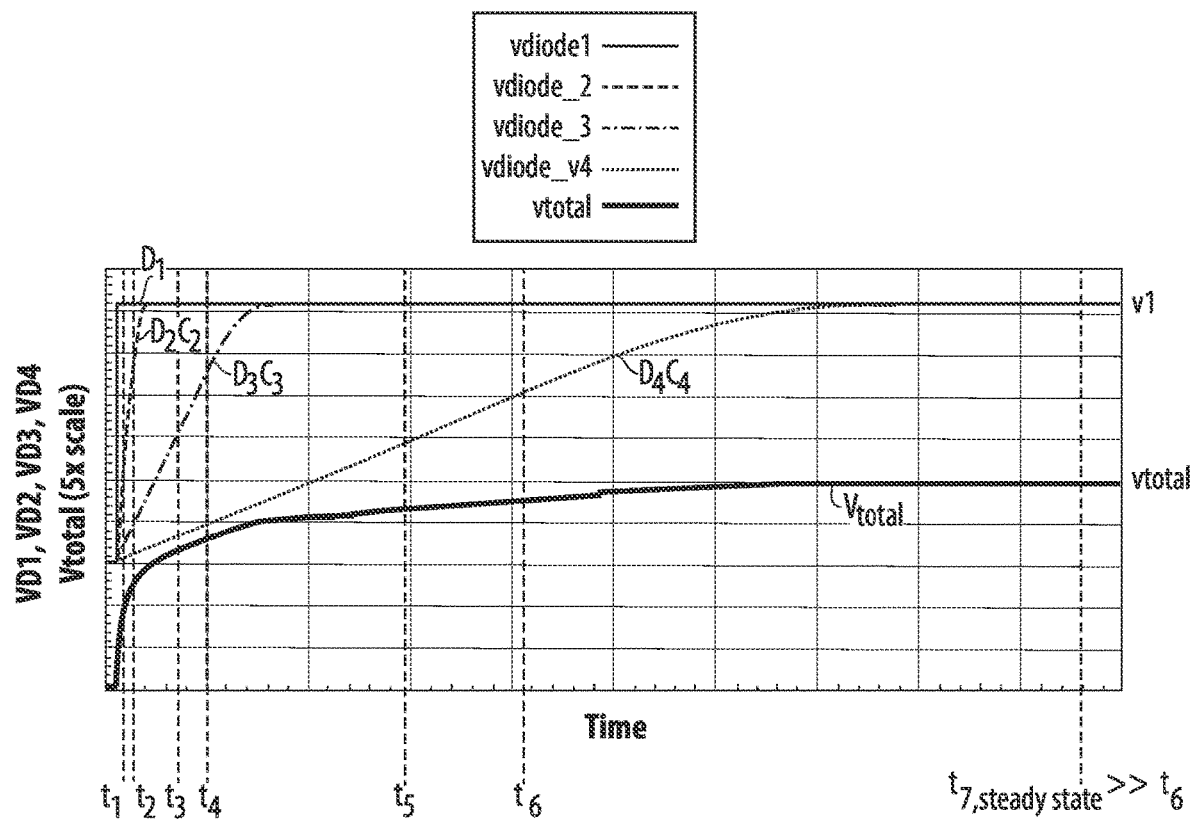
FIG. 2B is a chart showing an embodiment of total voltage over time in response to a step current, as well as the voltage components over time of each diode and DC pair for the embodiment of FIG. 2A.

Other embodiments and/or aspects of this disclosure are shown in FIGS. 2A and 2B. Certain embodiments described herein can be used to sense voltage on a plurality of diodes without dedicated voltage lines for each diode.

In accordance with at least one aspect of this disclosure, referring to FIG. 1, a diode voltage measurement system 100 can include a plurality of diodes 101a, 101b, 101c, 101d, 101e, 101N connected in series along a single line 103. The plurality of diodes 101a-101N can include N diodes, e.g., as shown in FIG. 1. N can be any suitable number greater than 1. The system 100 can include a plurality of capacitors 105b, 105c, 105d, 105e, 105N for at least N−1 of the diodes 101a-101N (e.g., one for each diode 101b-101N except the first diode 101a). Each capacitor 105b-105N can be connected in parallel to the single line 103 with a respective diode 101b-101N to form a respective diode-capacitor (DC) pair 107b, 107c, 107d, 107e, 107N. Each DC pair 101b-107N can be configured such that each DC pair 107b-107N reaches a steady state voltage at a different time. The system 100 can include a current supply 109 connected to the single line 103 to supply a current to the line 103.

The system 100 can include a control module 111 configured to sense a total voltage ($V_{total}$) across the single line 103 and to successively determine voltage of each diode 101a-101N from the total voltage based on the current, a known total steady state voltage, and known time-to-steady-state-voltages of each DC pair 107b-107N and/or diode 101a-101N. The control The control module 111 can be configured to determine a liquid contact state of each diode 101a-101N based on the voltage of each diode (e.g., as a fuel quantity sensor for $H_2$). For example, the voltage across each diode can indicate whether the diode is immersed in $H_2$ liquid. Any suitable correlation between voltage values and liquid contact state is contemplated herein (e.g., as appreciated by those having ordinary skill in the art). Any other suitable use of the voltage values and/or use for the diodes is contemplated herein. The control module 111 can include any suitable hardware and/or software configured to perform any suitable function (e.g., a disclosed herein).

The control module 111 can be configured to determine the voltage of a respective diode (e.g., diode 101N) of a last-to-steady-state-voltage DC pair (e.g., 107N) first, and to successively determine each voltage of each successive diode in order of decreasing time-to-steady-state-voltage until all voltages of all diodes have been determined. For example, the diodes 101a-101N can be positioned such that the last diode in the line 103 has the largest time-to-steady-state, and the diodes have declining time-to-steady-state in order toward to the first diode 101a. However, any other suitable physical order is contemplated herein.

Referring to the embodiment of FIGS. 2A and 2B, the control module 111 can be configured to determine the voltage (e.g., $V_{diode1}$) of a respective diode (e.g., diode 101d) of a last-to-steady-state-voltage DC pair (e.g., 107d) first, and to successively determine each voltage of each successive diode in order of decreasing time-to-steady-state-voltage until all voltages of all diodes have been determined. In certain embodiments, the control module 111 can be configured to determine a capacitance (e.g., $C_4$) of the last-to-steady-state-voltage capacitor 105d by sampling total voltage at two times (e.g., $t_6$ and $t_5$ as shown in FIG. 2B). As shown in FIG. 2A, hypothetical voltage test points are shown to depict voltage components shown in FIG. 2B. Both of the two times can be after all other faster-to-steady-state DC pairs 107b, 107c and/or diodes 101a have reached steady state voltage. For example, capacitance can be a function of the current and the total voltages at the two times (e.g., as described below in the example methodology).

The control module 111 can be configured to determine the next capacitance (e.g., $C_3$) of the next slowest DC pair (e.g., pair 107c) and/or diode (e.g., 101c) using the determined capacitance (e.g., $C_4$) of the last-to-steady-state-voltage capacitor (e.g., 101d) and by sampling total voltage at a different two times (e.g., $t_4$ and $t_3$). Both of the different two times can be after all other faster DC pairs (e.g., pair 107b) and/or diodes (e.g., diode 101a) have reached steady state voltage, but before the next slowest DC pair (e.g., pair 107c) and/or diode (e.g., diode 101c) reaches steady state voltage. This process can be repeated for all capacitors, e.g., as described in detail below. In certain embodiments, the capacitance (e.g., $C_3$ and $C_2$) of all capacitors can be determined before all voltages (e.g., $V_{diode1}$, $V_{diode2}$, $V_{diode3}$, $V_{diode4}$) are determined. However, any order of determining voltages and capacitances by the control module 111 is contemplated herein, as certain voltages may not be a function of faster-to-steady state capacitances to determine the respective voltage (e.g., as described further below).

The control module 111 can be configured to determine a voltage (e.g., $V_{diode3}$, $V_{diode2}$) of a respective diode (e.g., diode 101c, 101b) based on a determined capacitance (e.g., $C_3$, $C_2$) of a respective capacitor (e.g., 105c, 105b). The voltage of each diode may also be a function of each capacitance of each longer-to-steady-state capacitor (e.g., $V_{diode2}$ is a function of $C_2$, $C_3$, and $C_4$).

In certain embodiments, a first-to-steady-state-voltage diode 101a does not have an associated capacitor such that there are N−1 (e.g., 3 as shown in FIG. 2A) capacitors for N (e.g., 4 as shown in FIG. 2A) diodes 101a-101d. Thus the first to steady-state-voltage diode 101a can have no delay to steady state voltage as shown in FIG. 2B. The control module 111 can be configured to determine the voltage of the first-to-steady-state-voltage diode 101a last by subtracting all other determined voltages (e.g., $V_{diode2}$, $V_{diode3}$, $V_{diode4}$) from the total steady state voltage ($V_{7,ss}$).

The time-to-steady-state of each DC pair 107b-107N and/or diode 101a-101N can be separated by a multiple of at least 5. In certain embodiments, each capacitor 105b-105N can include the same dielectric material, and a nominal capacitance of each capacitor 105b-105N can be selected to provide a time-to-steady-state that is separated by a multiple of at least 5, e.g., as reflected in FIG. 2B.

In certain embodiments, the current can be a step current. Any suitable current supply is contemplated herein.

In accordance with at least one aspect of this disclosure, a control module (e.g., module 111) can be configured to sense a total voltage across a single line and to successively determine a voltage across each of a plurality of diodes on the single line from the total voltage based on a current and a known time-to-steady-state-voltage of at least one diode-capacitor (DC) pair having at least one diode of the plurality of diodes. The control module can be or include any suitable embodiment of a control module disclosed herein, e.g., described above.

FIG. 2A with Istep=I. Sample times $t_1$-$t_6$ are shown to calculate individual linear voltage slopes to determine values of $C_2$, $C_3$, and $C_4$.

An embodiment of a methodology is described below for a 4-node diode-capacitor ladder as shown in FIG. 2A. However, the below methodology can be extrapolated to any suitable number of diodes and/or diode-capacitor pairs.

Example Methodology

Referring to FIG. 2B, for a 4-element series diode-capacitor ladder, the total voltage measured at each time $t_7$ to $t_1$ as shown in FIG. 2B is summarized below in Table 1 for a step current of magnitude (I) applied at t=0;

TABLE 1

| Time | Vtotal (V) | Description |
| --- | --- | --- |
| $t_7$ | $V_{7,ss} = V_{D1} + V_{D2} + V_{D3} + V_{D4}$ | Steady State value |
| $t_6$ | $V_6 = V_{D1} + V_{D2} + V_{D3} + t_6 *(I/C_4)$ | D1, D2 & D3 in Steady State |
| $t_5$ | $V_5 = V_{D1} + V_{D2} + V_{D3} + t_5 *(I/C_4)$ | D1, D2 & D3 in Steady State |
| $t_4$ | $V_4 = V_{D1} + V_{D2} + t_4 *(I/C_3) + t_4 *(I/C_4)$ | D1 & D2 in Steady State |
| $t_3$ | $V_3 = V_{D1} + V_{D2} + t_3 *(I/C_3) + t_3 *(I/C_4)$ | D1 & D2 in Steady State |
| $t_2$ | $V_2 = V_{D1} + t_2 *(I/C_2) + t_2 *(I/C_3) + t_2 *(I/C_4)$ | D1 in Steady State |
| $t_1$ | $V_1 = V_{D1} + t_1 *(I/C_2) + t_1 *(I/C_3) + t_1 *(I/C_4)$ | D1 in Steady State |

In accordance with at least one aspect of this disclosure, a non-transitory computer readable medium can include computer executable instructions configured to cause a computer to perform a method. The method can include sensing a total voltage across a single line, and successively determining voltage across each of a plurality of diodes on the single line from the total voltage based on a current and a known time-to-steady-state-voltages of at least one diode-capacitor (DC) pair having at least one diode of the plurality of diode. The method can include determining a liquid contact state of each diode based on the voltage of each diode.

The method can include determining the voltage of a respective diode of a last-to-steady-state-voltage DC pair first, and successively determining each voltage of each successive diode in order of decreasing time-to-steady-state-voltage until all voltages of all diodes have been determined. The method can include determining a capacitance of the last-to-steady-state-voltage capacitor by sampling total voltage at two times, both of the two times being after all other faster-to-steady-state DC pairs and/or diodes have reached steady state voltage. The capacitance can be a function of the current and the total voltages at the two times.

The method can include any other suitable function of any suitable embodiment of a control module disclosed herein, e.g., described above. The method can include any other suitable method(s) and/or portion(s) thereof.

Embodiments can include capacitors used to separate the response of series diodes in the time domain. The last capacitor can have the largest capacitance, and each capacitor can be successively smaller until the first diode (e.g., which may have no capacitor as shown).

Embodiments can include a diode-capacitor temperature ladder utilizing a 2-wire interface. The embodiments can include a capacitance relationship as follows:

$$C_N \geq 5*C_{(N-1)}; \ldots ; C_5 \geq 5*C_4; C_4 \geq 5*C_3; C_3 \geq 5*C_2$$

FIG. 2B shows individual voltage across each diode and total series array voltage for a 4-element diode-cap ladder of The values of $C_4$, $C_3$ and $C_2$ can be calculated using the relationship;

$$I_{cap} = C(dv/dt) \quad \text{Equation(1)}$$

Since D1, D2 & D3 are in a steady state constant voltage condition in the region $t_5$ to $t_6$, C4 can be calculated simply as;

$$C4 = I*(dt/dv) = I*(t_6-t_5)/(V_6-V_5) \quad \text{Equation(2)}$$

With C4 now known, C3 can be calculated in the region $t_4$ to $t_3$, C3 can be calculated by recognizing that the linear slope in this region is sum of the dv/dt across both C3 & C4;

$$dV_{4-3}/dt_{4-3} = I/C3 + I/C4 = I(1/C3 + 1/C4)$$

$$[(V_4-V_3)/(t_4-t_3)]/I - 1/C4 = 1/C3$$

$$C3 = \frac{1}{[(V_4-V_3)/(t_4-t_3)]/I - 1/C4} \quad \text{Equation (3)}$$

Following the same procedure for calculating C3, C2 can now be calculated as;

$$C2 = \frac{1}{[(V_2-V_1)/(t_2-t_1)]/I - 1/C4 - 1/C3} \quad \text{Equation (3)}$$

Once C2, C3 and C4 are calculated, $V_{D4}$ to $V_{D1}$ can be calculated as follows beginning with $V_{D4}$. Subtracting $V_{7,ss} - V_6$ (reference equations in Table 1) yields:

$$V_{7,ss} - V_6 = V_{D4} - t_6*(I/C_4)$$

Solving for $V_{D4}$ gives:

$$V_{D4} = (V_{7,ss} - V_6) + t_6*(I/C4) \quad \text{Equation(4)}$$

With the calculation of $V_{D4}$ => $V_{D3}$ can now be calculated as follows:

Subtracting $V_{7,ss}-V_4$ yields:

$$V_{7,ss}-V_4=V_{D4}+V_{D3}-t_4*(I/C3)+t_4*(I/C4), \text{thus}$$

$$V_{D3}=(V_{7,ss}-V_4)-V_{D4}+t_4*(I/C3)+t_4*(I/C4) \quad \text{Equation(5)}$$

Now with the calculation of $V_{D4}$ & $V_{D3}$ => $V_{D2}$ can now be calculated as;

Subtracting $V_{7,ss}-V_2$ yields;

$$V_{7,ss}-V_2=V_{D4}+V_{D3}+V_{D2}-t_2*(I/C_2)-t_2*(I/C3)-t_2*(I/C4), \text{thus}$$

$$V_{D2}=(V_{7,ss}-V_2)-V_{D4}-V_{D3}+t_2*(I/C_2)+t_2*(I/C_3)+t_2*(I/C_4) \quad \text{Equation(6)}$$

Finally $V_{D1}$ is calculated by subtracting $V_{D2}+V_{D3}+V_{D4}$ from $V_{7,ss}$:

$$V_{D1}=V_{7,ss}-V_{D2}-V_{D3}-V_{D4} \quad \text{Equation(7)}$$

For ease of illustration, the procedure shown above is for a 4-element diode-cap ladder, but the methodology applied can be extended to any number of (N) parallel diode-capacitor elements. One having ordinary skill in the art in view of this disclosure would appreciate how to extrapolate to any suitable number N of diodes and pairs.

Embodiments can provide a multi-node diode based liquid level sensing element utilizing a 2-wire interface. Multiple diodes can be used to create a linear array such that the liquid $H_2$ level can be tracked in a piece-wise linear fashion in a given storage tank. Traditionally, this requires two wires per diode to measure the forward voltage of each diode in the "ladder" network with the number of dedicated wires quickly becoming unmanageable.

Embodiments can place the N diodes in series and then add a parallel capacitor across each device (e.g., except the first diode) such that a series array of N parallel (diode-capacitor) elements is created as shown in FIG. 1. Each capacitor can be sized such that they are a factor of ≥5× apart in value for each successive element. When a step current is applied to the series array, the resulting linear voltage ramp across each diode can be then initially governed by the parallel capacitor across the device with the resulting total voltage measured across diode and the entire series array, e.g., as shown in FIG. 2B. The initial voltage ramp across each diode can be essentially linear before the diode turns on since the vast majority of the current flows through the parallel capacitor until the diode turns on and eventually clamps the forward voltage to a steady state value for the constant current applied.

The distinctive linear voltage ramp of each section of the total voltage measurement can be used to first calculate the respective capacitor value across each diode. This can be accomplished by starting with the largest value capacitor in the region where all the smaller value capacitor values have fully charged and then working down successively in capacitor values to calculate the remaining capacitor values. Once the capacitor values are known, the resulting forward drop across each diode can then be calculated. Since the capacitor values are calculated using a known precision step current source and measuring the linear voltage ramp value in each section, any variance in the capacitor value due to temperature and/or tolerance is not an issue.

Embodiments of this disclosure can reduce the N+1 wires required for N diodes to only 2 wires total. This also reduces the system weight, connector complexity, and system cost. This can be particularly advantageous in highly insulated cryogenic tanks where the number of wires entering the tank must be minimized. Any other suitable application is contemplated herein.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A diode voltage measurement system, comprising:
a plurality of diodes connected in series along a single line, wherein the plurality of diodes include N diodes;
a plurality of capacitors for at least N−1 of the diodes, wherein each capacitor is connected in parallel to the single line with a respective diode to form a respective diode-capacitor (DC) pair, wherein each DC pair is configured such that each DC pair reaches a steady state voltage at a different time;
a current supply connected to the single line to supply a current to the line; and
a control module configured to sense a total voltage across the single line and to successively determine voltage of each diode from the total voltage based on the current, a known total steady state voltage, and known time-to-steady-state-voltages of each DC pair and/or diode.

2. The system of claim 1, wherein the control module is configured to determine a liquid contact state of each diode based on the voltage of each diode.

3. The system of claim 1, wherein the control module is configured to determine the voltage of a respective diode of a last-to-steady-state-voltage DC pair first, and to successively determine each voltage of each successive diode in order of decreasing time-to-steady-state-voltage until all voltages of all diodes have been determined.

4. The system of claim 3, wherein the control module is configured to determine a capacitance of the last-to-steady-state-voltage capacitor by sampling total voltage at two times, both of the two times being after all other faster-to-steady-state DC pairs and/or diodes have reached steady state voltage, wherein capacitance is a function of the current and the total voltages at the two times.

5. The system of claim 4, wherein the control module is configured to determine the next capacitance of the next slowest DC pair and/or diode using the determined capacitance of the last-to-steady-state-voltage capacitor and by sampling total voltage at a different two times, both of the different two times being after all other faster DC pairs and/or diodes have reached steady state voltage, but before the next slowest DC pair and/or diode reaches steady state voltage.

6. The system of claim 5, wherein the control module is configured to determine a voltage of a respective diode based on a determined capacitance of a respective capacitor.

7. The system of claim 4, wherein a first-to-steady-state-voltage diode does not have an associated capacitor such that there are N−1 capacitors for N diodes, and thus the first to steady-state-voltage diode has no delay to steady state voltage, wherein the control module is configured to determine the voltage of the first-to-steady-state-voltage diode last by subtracting all other determined voltages from the total steady state voltage.

8. The system of claim 7, wherein the time-to-steady-state of each DC pair and/or diode are separated by a multiple of at least 5.

9. The system of claim 8, wherein each capacitor includes the same dielectric material, and a nominal capacitance of each capacitor is selected to provide time-to-steady-state that is separated by a multiple of at least 5.

10. The system of claim 1, wherein the current is a step current.

11. A non-transitory computer readable medium, comprising computer executable instructions configured to cause a computer to perform a method, the method comprising:
sensing a total voltage across a single line; and
successively determining voltage across each of a plurality of diodes on the single line from the total voltage based on a current and a known time-to-steady-state-voltages of at least one diode-capacitor (DC) pair having at least one diode of the plurality of diode.

12. The non-transitory computer readable medium of claim 11, wherein the method includes determining a liquid contact state of each diode based on the voltage of each diode.

13. The non-transitory computer readable medium of claim 12, wherein the method includes determining the voltage of a respective diode of a last-to-steady-state-voltage DC pair first, and successively determining each voltage of each successive diode in order of decreasing time-to-steady-state-voltage until all voltages of all diodes have been determined.

14. The non-transitory computer readable medium of claim 13, wherein the method includes determining a capacitance of the last-to-steady-state-voltage capacitor by sampling total voltage at two times, both of the two times being after all other faster-to-steady-state DC pairs and/or diodes have reached steady state voltage, wherein capacitance is a function of the current and the total voltages at the two times.

* * * * *